United States Patent [19]

Howe

[11] 4,409,297

[45] Oct. 11, 1983

[54] COMPOSITE SUPERCONDUCTORS

[75] Inventor: David G. Howe, Greenbelt, Md.

[73] Assignee: The United States of America as represented by the Secretary of the Navy, Washington, D.C.

[21] Appl. No.: 263,664

[22] Filed: May 14, 1981

[51] Int. Cl.$^3$ ............................................. B32B 15/20
[52] U.S. Cl. .............................. 428/614; 174/126 S; 174/128 S; 428/662; 428/674; 428/930
[58] Field of Search ........................ 428/614, 660–664, 428/674, 930, 544; 174/126 S, 128 S

[56] References Cited

U.S. PATENT DOCUMENTS

| | | | |
|---|---|---|---|
| 3,811,185 | 5/1974 | Howe et al. | 29/599 |
| 3,887,364 | 6/1975 | Kawabe et al. | 148/32.5 |
| 3,926,684 | 12/1975 | Howe | 148/11.5 R |
| 3,989,475 | 11/1976 | Howe | 29/194 |
| 4,002,504 | 1/1977 | Howe | 29/599 |

FOREIGN PATENT DOCUMENTS

| | | | |
|---|---|---|---|
| 51-32478 | 9/1976 | Japan | 428/930 |
| 52-1278 | 1/1977 | Japan | |

OTHER PUBLICATIONS

Livingston, J. D. "Effect of Ta Additions to Bronze . . . " IEEE Trans. On Mag. vol. MAG 14 pp. 611–613 (9/78).
Howe, D. G., et al., "Effects of Formation Temperature . . . " Filamentary A15 Superconductors pp. 103–113 (1980).
Luhman, et al., "Improvements in Critical Current Densities of Nb$_3$Sn By Solid Solution Additions of SnInNb"; Advances in Cryogenic Eng. vol. 22, pp. 356–361 (1977).
Howe, H. G., et al., "Metallurgical and Superconducting Properties of Multifilamentary V$_3$Ga Wires"; Applied Superconductivity Conf. Knoxville, Tenn., pp. 1–3. (12/82).
Spencer, C. R. et al., "Formation of Multifilamentary V$_3$Ga With V-5 to V-7 Atomic Percent Ga Alloys", Advances in Cryogenic Engineering Materials, vol. 28, pp. 471'481 (1982).

Primary Examiner—Michael L. Lewis
Attorney, Agent, or Firm—Robert F. Beers; William T. Ellis; Thomas E. McDonnell

[57] ABSTRACT

A composite superconductor that comprises a first alloy selected from the class consisting of Nb-Sn-X, V-Ga-X, and V-Si-X wherein X is selected from the class consisting of yttrium, tellurium, lanthanum, cerium, gadolinium, erbium, and mixtures thereof and is in an amount up to 300% of the solubility limit of X in the alloy; a second alloy selected from the class consisting of Cu-Ga, Cu-Ga-Al, Cu-Su, and Cu-Si; and a continuous layer of an intermetallic A-15 compound between the alloys, the layer being formed by a solid state reaction between the alloys.

15 Claims, 4 Drawing Figures

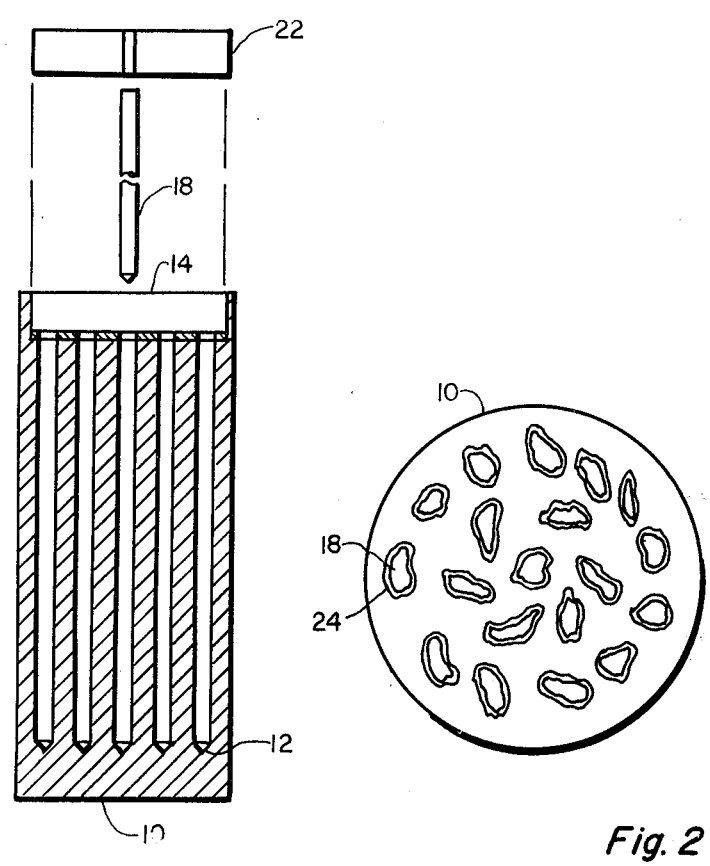

COMPOSITE SUPERCONDUCTORS

BACKGROUND OF THE INVENTION

The invention pertains generally to superconductors and in particular to superconductors made from a solid state reaction between two alloys.

In recent years superconductive materials have been proposed for use in many diversified applications. These include power transmission, levitated electromagnetic land transportation systems, naval propulsion systems, aircraft ac generators, and large laboratory research magnets. Superconducting generators may be only one-tenth to one-third the size of conventional electrical generators of the same power rating. Savings are realized in operating these systems when superconductive materials with high critical temperature, critical current density, and critical field are used.

Intermetallic compounds having an A-15 crystal structure are known to be exceptional superconducting materials. This structure is also referred to as a beta-tungsten crystalline structure. One of the ways in which these compounds are obtained is by a solid state reaction between two alloys in a vacuum or inert atmosphere at an elevated temperature. These compounds are then used in a composite structure with the two reactant alloys, often one being in the form of one or more filaments embedded in the other alloy (often referred to as the matrix). Excellent examples of such superconductors are composites of VGa-$V_3$Ga-CuGa, VGa-$V_3$Ga-CuGaAl, NbSn-$Nb_3$Sn-CuSn, and VSi-V,Si-CuSi. These superconductors, along with their processing, have been disclosed in U.S. Pat. Nos. 3,811,185; 3,926,684; 3,989,475; 4,002,504; and 4,190,701.

Two major objectives in research concerning these superconductors are improving the electrical properties and the processing capabilities of the materials. The critical current density and the ductility are of particular interest.

Critical current values indicate the ability of the material to carry large currents, and is defined as the maximum current passed through a conductor in a transverse magnetic field before a measurable voltage appears in the conductor. By dividing the critical current by the cross-sectional area, values for the critical current density are obtained.

It is known that reducing the grain size of the intermetallic A-15 material increases the number of flux-pinning sites and thus the critical current. One method of refining grain size is lowering the A-15 formation temperature which slows down the solid state reaction and increases production costs. Varying the composition of the reactant alloys in the composite can improve the grain size, but can also detrimentally affect the processing of the composites.

Processing the composites into useable shapes is extremely difficult and is often just barely possible. The reactant alloys become hard and brittle through work hardening and the A-15 compounds are inherently brittle.

Much of the work hardening occurs because of interstitial impurities. Another problem associated with impurities in the reactant alloys is the adverse affect impurities may have on the tightness of the bond between the reactant alloys. Although the processing technique disclosed in U.S. Pat. No. 4,002,504 by Howe has produced a superconductor with few interstitial impurities, the amount of impurities still present causes serious problems.

SUMMARY OF THE INVENTION

It is, therefore, an object of the present invention to improve the ductility of the filament alloy of a composite superconductor and therefore enhance the metallurgical processing of the composite superconductor.

Another object of the present invention is to refine the grain size of the intermetallic A-15 compound.

A further object of this invention is to improve the reliability and efficiency of the metallurgical processing of composite superconductors.

These and other objects are achieved by the incorporation of a metal selected from the class consisting of yttrium, tellurium, lanthanum, cerium, gadolinium, erbium, and mixtures thereof into the filament alloy selected from the class consisting of Cu-GA, Cu-GA-Al, Cu-Sn, and Cu-Si in an amount sufficient to substantially getter interstitial impurities and to impart in the inner alloy an amount of the metal to refine the grains of the A-15 compound.

BRIEF DESCRIPTION OF THE DRAWINGS

FIG. 1 is a cross-sectional view of an unassembled multifilament matrix, a single filament, and an end plug utilized in the fabrication of superconductors of this invention.

FIG. 2 is a cross-sectional view of a composite superconductor of the present invention.

DETAILED DESCRIPTION OF THE INVENTION

Figure 3:
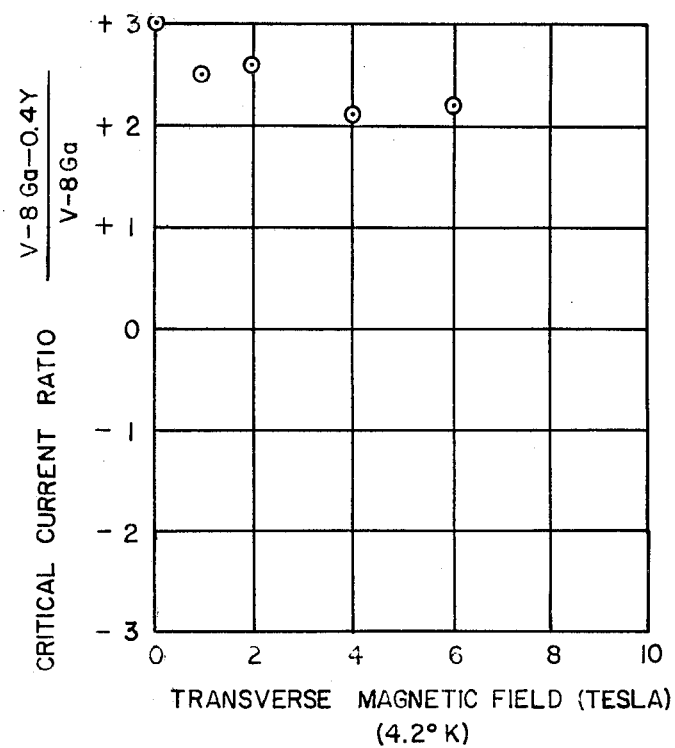
FIG. 3 is a graphical representation of the critical current ratio of a (Cu-17.5Ga-0.5Al)-($V_3$Ga)-(V-8Ga-0.4Y) superconductor and a (Cu-17.5Ga-0.5Al)-($V_3$Ga)-(V-8Ga) superconductor as a function of transverse magnetic field at 4.2K.

The third metal, being added to the filament alloys, is more reactive with anionic impurities (including carbon) than the solute metal of the alloy, e.g., gallium, tin, and silicon. Further this metal or a combination of metals promotes a fine grain growth. Experimentation and preliminary studies indicate that yttrium, tellurium, lanthanum, cerium, gadolinium, erbium, and mixtures thereof are suitable, but yttrium and cerium are preferred.

The amount of the third metal depends on the purity of the binary alloy, in that the amount should at least be sufficient to substantially getter interstitial impurities and alloy an amount up to about three times the solubility limit of the third metal in the binary alloy. Alloying an amount in excess of the solibility limit does create a second phase, but due to relatively low solubility and therefore relatively small amounts of the third metal, the second phase is well dispersed throughout the alloy. The high dispersion of the second phase minimizes any adverse effect of a second phase on the mechanical strength of the superconductor. Although any amount of the third metal in this range improves the finished superconductor, amounts less than 5 percent of the solubility limit would produce a very small improvement in the grain size and ductility.

In light of these considerations, the preferred amount of the third metal, on the basis of percent of the solubility limit of the third metal in the binary alloy, is from 5 to 200 percent. The most preferred range, on the above basis, is from 20 to 80 percent.

For composite superconductors prepared from alloys with at least three-nines purity and processed by the method disclosed in U.S. Pat. No. 4,002,504, issued on Jan. 11, 1977, to David G. Howe, the amount of the third metal to be added to the binary alloy is from 0.01 to 1.0 atomic percent, with 0.05 to 0.5 atomic percent preferred, and 0.1 to 0.4 atomic percent most preferred.

Composite superconductors with the following alloys can be improved by the addition of a subject third metal into the binary alloys of the filament alloy.

The first alloy or matrix alloy is selected from the class consisting of Cu-Ga alloy with a gallium content from 0.4 to 22 at. %, Cu-Ga-Al alloy with a gallium content from 0.4 to 2 at. % and an aluminum content from 0.1 to 6 at. %, Cu-Sn alloy with a tin content from 1 to 11 at. %, and Cu-Si alloy with a silicon content from 0.5 to 14. The preferred alloys are selected from the class consisting of Cu-Ga alloy with a gallium content from 1.5 to 18 and Cu-Ga-Al alloy with a gallium content from 1.2 to 14 and an aluminum content from 0.5 to 4.5.

The second or filament alloy is selected from the class consisting of Nb-Sn alloy with a tin content from about 0.1 to about 12 at. %, V-Ga with a gallium content from about 0.4 to 12.5 at. %, and V-Si with a silicon content from 0.5 to 9 at. %. The preferred alloy is vanadium gallium with a gallium content from 2 to 9. It is this alloy to which the subject third metal(s) is added. The third metal can be added during the casting of the binary alloy into the general shape utilized in fabricating the composite superconductor. In the molten state, the interstitial impurities combine with the third metal and precipitate out at the surface of the melt where the precipitate can be later removed. It is possible to solidify the molten alloy and remove, e.g., by cutting off, filing or grinding the top part of the solid shape.

Throughout the above description, one of the alloys is referred to as the filament alloy and the other as the matrix alloy. These terms arise from the usual configuration of the composite superconductor as a multi-filament wire shown in FIG. 1 in a pre-assembly state and in FIG. 2 after assembly and reaction. Although the usual configuration is a multifilament wire, The present invention is not limited to this configuration. For example, the composite can be, a monofilament wire or have a sandwich structure.

Briefly, the composite assembly shown in FIG. 1 comprises a matrix rod 10 with multiple cavities 12 which may or may not be tapered and with a recess 14 at the open end of the matrix rod, filaments 18, and an end plug 22. A cross sectional view of a multifilament superconducting wire prepared from the above assembly is shown in FIG. 2 wherein the A-15 compound layer 24 is produced by a solid state reaction between a filament 18 and the matrix rod 10.

Except for the addition of the third metal to the molten filament alloy, processing the composite superconductors of the present invention is the same as the method described in U.S. Pat. No. 4,002,504, issued on Jan. 11, 1977, to David G. Howe, which is incorporated herein by reference. This method is also described in *Filamentary A15 Superconductors*, ed. by Masaki Suenaga and Alan F. Clark, Plenum, N.Y., 1980, p. 103-114 which is hereby incorporated by reference.

The general nature of the invention having been set forth, the following examples are presented as specific illustration of the practice thereof. It is understood that the invention is not limited to the examples but is susceptible to different modifications that would be recognized by one of ordinary skill in the art.

EXAMPLE I

Two monofilament composite wires (0.0813 cm, in dia.) with a matrix composition of Cu-17.5Ga-0.5Al were prepared. The compositions of the filaments for each of the composite wires were V-8Ga for the first wire and V-8Ga-0.4Y for the second wire. The numbers preceding the elements of the above alloys were, of course, atomic percent.

Rods of the above alloys were prepared from high-purity metals (99.999%Cu, 99.9%V, 99.99%Ga, 99.9%Al, and 99.9%Y).

The V-Ga alloy was arc melted and cast as a 1.27 cm diameter rod. After a homogenization anneal in an evacuated silica ampoule at a temperature of 1100° C. for about 64 hours, the V-Ga rod was removed from the furnace and was cooled in the silica ampoule to room temperature. The cooling lasted about 1½ hours. The rod was swaged at room temperature to 0.636 cm. An intermediate anneal was given for two hours at 800° C.

The V-Ga-Y rod was prepared by adding 0.4 at. % of yttrium to the arc melt of V-8Ga alloy. A precipitate was formed at the surface of the melt and selected areas in the top layer of the casting were removed. The alloy was processed to a 0.636 cm in the same manner as the V-8Ga rod.

The Cu-Ga-Al alloy was induction melted, cast as two 1.85 cm diameter rods, surface-cleaned by machining to a 1.25 cm diameter. The rods were annealed at 700° C. for sixteen hours and one hole was machined in each rod to accept a filament rod. The machined rods were cleaned and annealed at 700° C. for two hours. Following a final cleaning by chemical etching, the filament rods were placed into each Cu-Ga-Al rod which, in turn, were capped with a channeled Cu-Ga-Al end plug. The composite assembly was evacuated to a pressure of $1 \times 10^5$ torr and sealed with an electron-beam weld.

The cross sectional area of the assembly was reduced by one-half by drawing and swaging. An intermediate anneal of 500° C. for one hour was given after the reduction. Another reduction by 40 percent followed by an anneal of 500° C. for one hour was used. With the third reduction by 40 percent an anneal at 550° C. for one hour was used. A second series of reductions followed by anneals brought the final diameter of the wires to 0.03 cm.

The composite without yttrium was heated at 700° C. for 360 hours and the composite with yttrium was heated at 700° C. for 256 hours. Each wire was tested at 4.2K and the $J_c$ values were obtained at a transverse magnetic field strengths of 0, 1, 2, 4, and 6 Tesla. The ratios of the measured $I_c$ values as a function transverse magnetic field strength are graphically shown in FIG. 3.

EXAMPLE II

Three monofilament composite wires with a matrix composition of Cu-17.5Ga-0.5Al were prepared. The cast compositions of the filaments for each of the composite were V-8Ga for the first wire, V-8Ga-0.1Y for the second, and V-8Ga-0.4Y for the third Again the alloy compositions are expressed in atomic percent.

Figure 4:
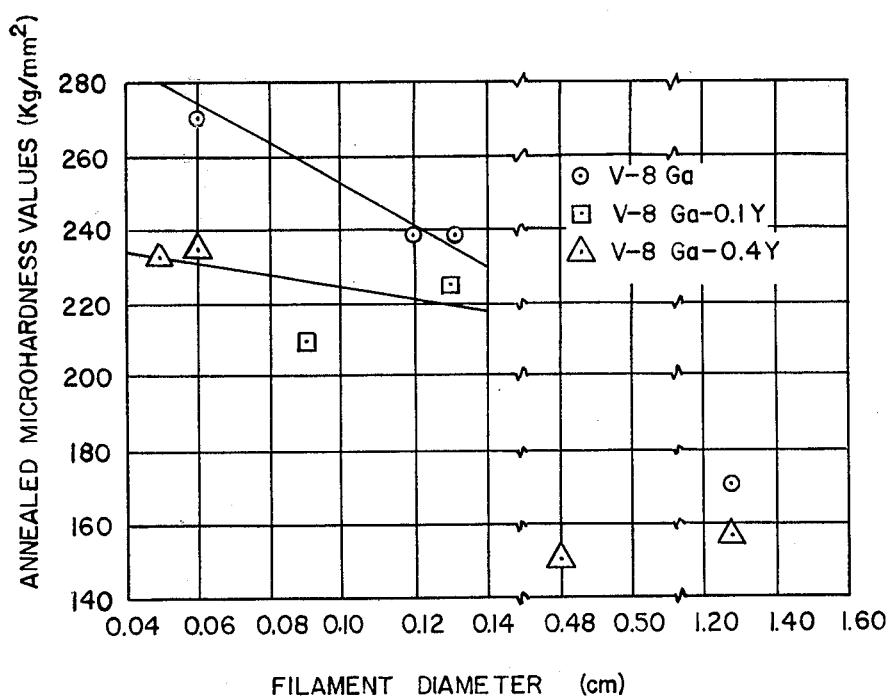
FIG. 4 is a graphical representation of hardness of the superconductor of the present invention and a comparable superconductor without an yttrium addition as a function of filament diameter.

The preparation described in Example I was used to prepare the samples except no A-15 layer was produced. The series of reductions produced composites with filament diameters of 0.48 cm, 0.13 cm, 0.12 cm, 0.09 cm, 0.06 cm, and 0.05 cm. The microhardness of the filaments at the above diameters and at the initial cast diameter of 1.27 cm was determined by the Diamond-Pyramid Hardness Test on a Leitz Microhardness Tester with a 100 g loading. FIG. 4 graphically illustrates the hardness as a function of filament diameter.

EXAMPLE III

Two monofilament composite wires with a matrix composition of Cu-17.5Ga-0.5Al were prepared. The cast compositions of the filament for each of the composite wires were V-8Ga-0.2Y and V-8Ga-0.2Ce.

The preparation described in Example I was used to prepare the samples except that the two alloys were not reacted to produce the A-15 layer. The composites were reduced to a diameter of 0.48 cm. The microhardness of the two composites was tested in the manner described in Example II. The results were 158 and 160 kg/mm$^2$ for the yttrium composite and the cerium composite respectively.

The results in FIG. 3 show a significant improvement in the critical current with the addition of yttrium. Even though the yttrium-containing composite was reacted for 104 hours less than the other composite, the yttrium-composite maintained a critical current of more than two times that of the other composite. The results shown in FIG. 4 illustrate the substantial reduction in the hardness and therefore the enhanced ductility of the composite wires with additions of yttrium, especially at smaller diameters and thus greater cumulative reductions in cross-sectional areas. The results in Example III indicate that the addition of cerium has an effect similar to that produced by the addition of yttrium.

Obviously many modifications and variations of the present invention are possible in light of the above teachings. It is therefore to be understood that within the scope of the appended claims the invention may be practiced otherwise than as specifically described.

What is claimed is:

1. A composite superconductor comprising:
   a first reactant alloy selected from the class consisting of Cu-aGa wherein a is from about 0.4 to about 22 at. %, Cu-bGa-cAl wherein b is from about 0.4 to about 20 at. % and c is from about 0.1 to about 6, Cu-dSn wherein d is from about 1 to about 11, and Cu-eSi wherein e is from about 0.5 to about 14;
   a second reactant alloy of a ternary alloy selected from the class consisting of Nb-fSn-yX, V-gGa-yX, and V-hSi-yX wherein X is selected from the class consisting of yttrium, tellurium, cerium, lanthanium, erbium, gadolinium, and mixtures thereof, f is from about 0.1 to about 12, g is from about 0.4 to about 12.5, h is from about 0.5 to 9, and y is an amount up to 300 percent of the solubility limit of X in said alloy; and
   a continuous intermediate layer of an intermetallic A-15 compound between said first and second alloys, said layer being produced by a solid state reaction between said alloys.

2. The superconductor of claim 1 wherein said matrix is an alloy selected from the class consisting of Cu-aGa and Cu-bGa-cAl and each filament is V-gGa-yX.

3. The superconductor of claim 2 wherein X is selected from the class consisting of yttrium, cerium and erbium.

4. The superconductor of claim 2 wherein X is selected from the class consisting of yttrium and cerium.

5. The superconductor of claim 1 wherein said matrix is Cu-eSi and each filament is V-hSi-yX.

6. The superconductor of claim 5 wherein X is selected from the class consisting of yttrium, cerium, erbium, and mixture thereof.

7. The superconductor of claim 5 wherein X is selected from the class consisting of yttrium, cerium, and mixtures thereof.

8. The superconductor of claim 3 wherein a is from 1.5 to 18, b is from 1.2 to 14, c is from 0.5 to 4.5, and g is from 2 to 9.

9. The superconductor of claim 4 wherein a is from 1.5 to 18, b is from 1.2 to 14, c is from 0.5 to 4.5, and g is from 2 to 9.

10. The superconductor of claim 6 wherein a is from 1.5 to 18, b is from 1.2 to 1, c is from 0.5 to 4.5, and g is from 2 to 9.

11. The superconductor of claim 8 wherein g is from 5 to 8 at. %.

12. The superconductor of claim 9 wherein g is from 5 to 8 at. %.

13. The superconductor of claim 10 wherein g is from 5 to 8 at. %.

14. The superconductor of claim 8, 9, 10, 11, 12, or 13 wherein y is from about 30 percent to 100 percent of the solubility limit of X in said alloy.

15. The superconductor of claim 8, 9, 10, 11, 12, or 13 wherein y is from 60 percent to 100% of the solubility limit of X in said alloy.

* * * * *